(12) United States Patent
Lim et al.

(10) Patent No.: US 9,836,125 B2
(45) Date of Patent: Dec. 5, 2017

(54) MULTILAYER TRANSFORMABLE DEVICE AND DISPLAY DEVICE COMPRISING THE SAME

(71) Applicant: LG DISPLAY CO., LTD., Seoul (KR)

(72) Inventors: MyungJin Lim, Goyang-si (KR); SuSeok Choi, Seongnam-si (KR); Yong-Su Ham, Seoul (KR); Taeheon Kim, Seoul (KR); YongWoo Lee, Goyang-si (KR); Seulgi Choi, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/971,170

(22) Filed: Dec. 16, 2015

(65) Prior Publication Data

US 2016/0187985 A1    Jun. 30, 2016

(30) Foreign Application Priority Data

Dec. 31, 2014    (KR) .................. 10-2014-0195908
Jun. 18, 2015    (KR) .................. 10-2015-0086831

(51) Int. Cl.
| | | |
|---|---|---|
| G06F 3/041 | (2006.01) | |
| G06F 3/01 | (2006.01) | |
| H01L 41/083 | (2006.01) | |
| H01L 41/193 | (2006.01) | |
| H01L 41/09 | (2006.01) | |

(52) U.S. Cl.
CPC ............ *G06F 3/016* (2013.01); *G06F 3/0412* (2013.01); *H01L 41/083* (2013.01); *H01L 41/0926* (2013.01); *H01L 41/193* (2013.01); *G06F 2203/04102* (2013.01)

(58) Field of Classification Search
CPC ............... G06F 3/016; G06F 3/03; G06F 3/041–3/047; G06F 2203/013–2203/015; G06F 2203/04102–2203/04105; G06F 1/1652; H04M 1/0268; G09B 21/003–21/004; H01H 2215/00; H01H 2215/028
USPC .................................................. 345/173–179
See application file for complete search history.

(56) References Cited

U.S. PATENT DOCUMENTS 6,150,456 A * 11/2000 Lee .......................... B32B 27/34
                                                           428/325
6,940,211 B2 * 9/2005 Pelrine ..................... F04B 35/00
                                                           310/330

(Continued)

FOREIGN PATENT DOCUMENTS

| JP | 2011006596 A | 1/2011 |
|---|---|---|
| JP | 2014044446 A | 3/2014 |

(Continued)

*Primary Examiner* — Roberto Flores
(74) *Attorney, Agent, or Firm* — Dentons US LLP

(57) ABSTRACT

Provided is a multilayer transformable device with enhanced driving displacement and a display device including the same. The multilayer transformable device, for example, includes a plurality of unit transformable devices, each of the unit transformable devices that includes a lower electrode, an upper electrode, and a transformable layer including an electro-active polymer (EAP) and a sub-transformable layer disposed between the plurality of unit transformable devices, the sub-transformable layer including a sub-EAP different from the EAP.

15 Claims, 5 Drawing Sheets

(56) References Cited

U.S. PATENT DOCUMENTS

| | | | |
|---|---|---|---|
| 2002/0130673 A1* | 9/2002 | Pelrine | A63H 3/365 |
| | | | 324/727 |
| 2004/0217671 A1* | 11/2004 | Rosenthal | A61M 5/142 |
| | | | 310/328 |
| 2005/0200286 A1* | 9/2005 | Stoschek | B60K 35/00 |
| | | | 315/77 |
| 2007/0182718 A1* | 8/2007 | Schoener | B60K 35/00 |
| | | | 345/173 |
| 2008/0083314 A1* | 4/2008 | Hayashi | G06F 3/016 |
| | | | 84/22 |
| 2009/0308737 A1* | 12/2009 | Kudoh | B81B 3/0021 |
| | | | 204/242 |
| 2010/0026143 A1 | 2/2010 | Pelrine et al. | |
| 2010/0068485 A1 | 3/2010 | Ounaies et al. | |
| 2010/0321335 A1* | 12/2010 | Lim | G06F 3/016 |
| | | | 345/174 |
| 2011/0181530 A1* | 7/2011 | Park | G06F 3/016 |
| | | | 345/173 |
| 2012/0086651 A1* | 4/2012 | Kwon | G06F 3/016 |
| | | | 345/173 |
| 2012/0262410 A1* | 10/2012 | Lim | G06F 3/044 |
| | | | 345/174 |
| 2012/0313860 A1* | 12/2012 | Hashimura | B82Y 15/00 |
| | | | 345/173 |
| 2013/0286462 A1* | 10/2013 | Yeo | G09G 5/00 |
| | | | 359/291 |
| 2014/0104696 A1 | 4/2014 | Moreau et al. | |
| 2015/0008798 A1 | 1/2015 | Kato et al. | |
| 2015/0073072 A1* | 3/2015 | Kim | H01B 3/447 |
| | | | 524/106 |
| 2015/0102947 A1* | 4/2015 | Chung | G06F 3/016 |
| | | | 341/27 |
| 2015/0155474 A1 | 6/2015 | Tanimoto et al. | |
| 2015/0316986 A1* | 11/2015 | Xue | G06F 3/041 |
| | | | 345/173 |
| 2015/0346881 A1* | 12/2015 | Watazu | G01L 1/16 |
| | | | 345/174 |

FOREIGN PATENT DOCUMENTS

| | | |
|---|---|---|
| JP | 2014515704 A | 7/2014 |
| WO | 03/081762 A1 | 10/2003 |
| WO | 2005/117170 A2 | 12/2005 |
| WO | 2013122110 A1 | 8/2013 |
| WO | 2013183594 A1 | 12/2013 |
| WO | 2014030963 A1 | 2/2014 |

* cited by examiner

MULTILAYER TRANSFORMABLE DEVICE AND DISPLAY DEVICE COMPRISING THE SAME

This application claims the priorities of Korean Patent Application No. 10-2014-0195908 filed on Dec. 31, 2014 and Korean Patent Application No. 10-2015-0086831 filed on Jun. 18, 2015, which are incorporated herein by reference for all purposes as if fully set forth herein.

BACKGROUND OF THE INVENTION

Field of the Invention

The present disclosure relates to a transformable device and a display device including the same and, more specifically, to a multilayer transformable device having enhanced bending ability and a display device including the same.

Discussion of the Related Art

Recently, various display devices including liquid crystal displays (LCDs) and organic light-emitting diodes (OELDs) have touch functionality, as users desire to conveniently interact with their display devices. In this regard, researches have been continuously conducted into a transformable device and its integration into a flexible display device that can provide direct and various touch feedbacks to users.

In general, a conventional display device has used a vibration motor such as an eccentric rotating mass vibration motor (ERM) or a linear resonance actuator (LRA) as a transformable device. The vibration motor is designed to vibrate the whole display device, and thus has a problem in that its mass body needs to be increased in size to increase its vibration power. In addition, the vibration motor has disadvantages in that frequency modulation for adjusting a level of vibration is difficult, a speed of response is significantly low, and the vibration motor is not suitably used for a flexible display device.

To address these issues, a shape memory alloy (SMA) and electro-active ceramics (EAC) have been developed as materials for a transformable device. However, the SMA has a low speed of response and a short lifespan, and is opaque, and the EAC is fragile. Thus, there has been difficulty in applying the SMA and the EAC to a display device, in particular, to a flexible display device.

A transformable device technology using an electro-active polymer (EAP) has recently been receiving attention in the industry. The EAP refers to a polymer that can be deformed by an electrical stimulation. More particularly, the EAP can repeatedly expand, contract and bend by an electrical stimulation. Among various types of EAPs, a ferroelectric polymer and a dielectric elastomer have been mainly used. Examples of ferroelectric polymer are polyvinylidene fluoride (PVDF) and P(VDF-TrFE)(Poly(VinyliDene Fluoride)-trifluoroethylene), and examples of dielectric elastomer are a silicone-based polymer, a urethane-based polymer, an acrylic-based polymer, and the like. A transformable device including the EAP as an electro-active layer has been manufactured and attached to a flexible display panel to implement diverse bending of a display device.

However, such a transformable layer that uses only one transformable layer such as the EAP may have difficulty in implementing sufficient driving displacement. When a thickness of the transformable layer is increased to enhance driving displacement, its bending ability may become restricted due to its increased thickness. Moreover, the increased thickness of the transformable layer may require high driving voltage, and thus, may not be suitable for mobile displays.

SUMMARY OF THE INVENTION

Accordingly, the present invention is directed to a transformable device, a display device including the same, and a method of manufacturing the same that substantially obviate one or more problems due to limitations and disadvantages of the related art.

An advantage of the present invention is to provide a transformable device and a display device including the same with enhanced bending ability.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may, for example, include a display panel; a multilayer transformable device on the display panel, the multilayer transformable device including: at least two unit transformable devices, each of the at least two unit transformable devices including a first electrode, a second electrode, and a transformable layer between the first and second electrode, and a sub-transformable layer between the at least two unit transformable devices, wherein the transformable layer of each of the at least two unit transformable devices and the sub-transformable layer include an electro-active polymer, and wherein the electro-active polymer of the sub-transformable layer is different from the electro-active polymer of the transformable layer.

In another aspect of the present disclosure, a multilayer transformable device may, for example, include at least two unit transformable devices, each of the at least two unit transformable devices including a first electrode, a second electrode, and a transformable layer between the first and second electrode, and a sub-transformable layer between the at least two unit transformable devices, wherein the transformable layer of each of the at least two unit transformable devices and the sub-transformable layer include an electro-active polymer, and wherein the electro-active polymer of the sub-transformable layer is different from the electro-active polymer of the transformable layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
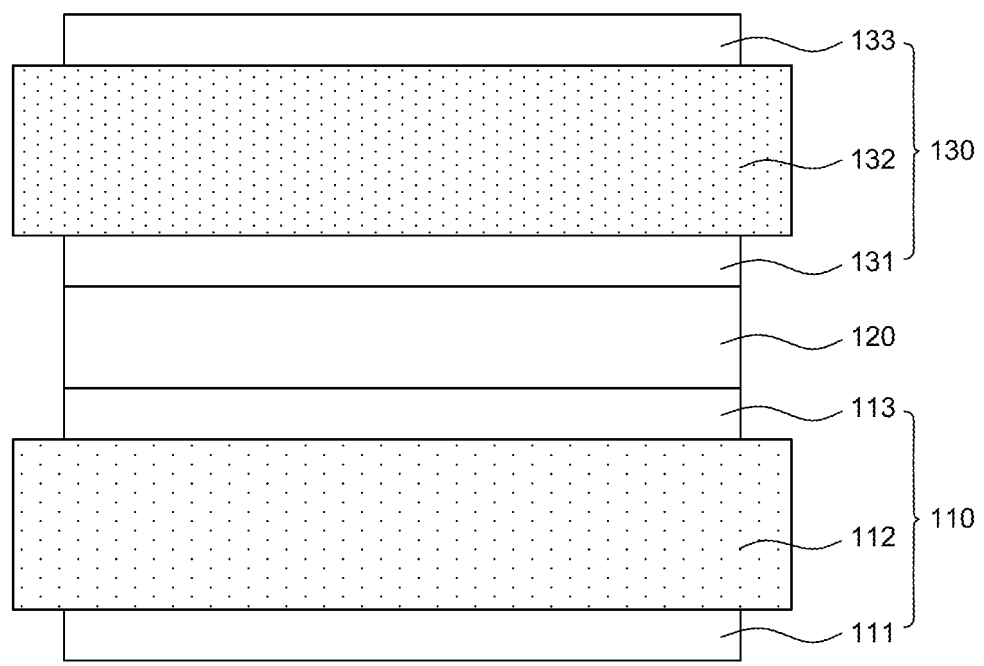
FIG. 1 is a schematic cross-sectional view illustrating a multilayer transformable device according to an embodiment of the present disclosure.

Advantages and features of the present disclosure and methods of accomplishing the same may be understood more readily with reference to the following detailed description of exemplary embodiments and the accompanying drawings. However, the present disclosure will be embodied in many different forms and is not limited to the embodiments set forth herein. Rather, these embodiments make the present disclosure complete, and are provided such that those skilled in the art fully understand the scope of the present disclosure. The present disclosure will be merely defined by the appended claims.

A shape, a size, a ratio, an angle, the number, and the like disclosed in the drawings for description of embodiments of the present disclosure are merely illustrative, and thus the present disclosure is not restricted thereto. The same reference numeral refers to the same component throughout the specification. In addition, in description of the present disclosure, when specific description of the related art is determined to may unnecessarily obscure the subject matter of the present disclosure, a detailed description thereof will be omitted. When the terms "include", "have", "contain", and the like mentioned in the present specification are used, a part not mentioned can be additionally included unless the term "only" is used. Singular forms are intended to include the plural forms as well, unless the context clearly indicates otherwise.

In interpretation of a component, an error range is construed to be included even when an explicit description is not separately provided.

In a description of a location relation of two portions, for example, when the terms "on", "over", "below", "next to", and the like are used, one or more other portions can be located between the two portions unless the term "immediately" or "direction" is used.

When an element or layer is described to be "on" another element or layer, the element or layer may be disposed directly on the other element or layer or disposed on the other element or layer with a still another element or layer interposed therebetween.

Although the terms "first", "second", and the like are used to describe various components, the components are not limited by the terms. The terms are merely used to distinguish one component from another component. Thus, a first component mentioned below may correspond to a second component within the present disclosure.

A size and a thickness of each configuration illustrated in the drawings are for convenience of description, and the present disclosure is not necessarily limited to the size and thickness of the illustrated configuration.

Respective features of several embodiments of the present disclosure may be wholly or partially combined or united with each other, and interlocking and driving can be technically configured in various manners. Respective embodiments may be implemented independently of each other or implemented together by being linked to each other.

In the present specification, a transformable layer refers to a layer, a shape of which can be deformed by implementing contraction, expansion, or bending in response to an applied voltage or current.

Reference will now be made in detail to embodiments of the present invention, examples of which are illustrated in the accompanying drawings. Wherever possible, the same reference numbers will be used throughout the drawings to refer to the same or like parts.

FIG. 1 is a schematic cross-sectional view illustrating a configuration of a multilayer transformable device according to an embodiment of the present disclosure.

Referring to FIG. 1, a multilayer transformable device 100 according to the present embodiment includes a first transformable device 110 having a first transformable layer 112, a first electrode 111, i.e. a first lower electrode 111, and a second electrode 113, i.e. a first upper electrode 113, a sub-transformable layer 120 disposed on the first transformable device 110, and a second transformable device 130 which is disposed on the sub-transformable layer 120 and has a second transformable layer 132, a first electrode 131, i.e. a second lower electrode 131, and a second electrode 133, i.e. a second upper electrode 133. Herein, the terms "lower" and "upper" refer to an orientation of the multilayer transformable device 100 with the first transformable device 110 being disposed below the second transformable device 100 with respect to direction of gravity.

The first transformable device 110 is a unit transformable device included in the multilayer transformable device 100, and implements vibration or bending by a voltage applied to the first lower electrode 111 and the first upper electrode 113. To do so, the first transformable layer 112 includes an electro-active polymer (EAP).

The first transformable layer 112 is disposed between the first lower electrode 111 and the first upper electrode 113 to function as an electro-active layer that can be deformed by an electrical stimulation. The EPA layer of the first transformable layer 112 is a polymer material that can be deformed by an electrical stimulation. For example, the first transformable layer 112 may include a silicone-based, urethane-based, or acrylic-based dielectric elastomer, or a ferroelectric polymer such as a polyvinylidene fluoride (PVDF)-based polymer.

When the first transformable layer 112 includes a dielectric elastomer, the dielectric elastomer may contract or expand due to a coulombic force generated in response to a voltage applied to the first transformable layer 112, thereby deforming the transformable device 100. In addition, when the first transformable layer 112 includes a ferroelectric polymer, an alignment direction of dipoles in the first transformable layer 112 may be changed in response to a voltage applied to the first transformable layer 112, thereby deforming the transformable device 100.

The EAP included in the first transformable layer 112 may be a PVDF-based polymer, which is a ferroelectric polymer that maintains a polarization state in its natural state. In general, a PVDF-based polymer has a greater permittivity and driving displacement than those of a dielectric elastomer, and has an advantage in that deformation of the multilayer transformable device 100 can be easily controlled using a polarization direction of the PVDF-based polymer.

Hereinafter, a description will be given on the assumption that the first transformable layer 112 includes a PVDF-based polymer by way of example.

The PVDF-based polymer refers to a polymer that includes a PVDF repeating unit in a main chain of the polymer. Examples of the PVDF-based polymer may include a PVDF homo-polymer or a PVDF co-polymer. In this instance, the first transformable layer 112 may be manufactured in a film type.

When a dielectric elastomer such as polydimethyl siloxane (PDMS) is used, the transformable layer may be formed by a solution casting method of applying a solution to a substrate and drying the solution. In this instance, the multilayer transformable device may be manufactured by alternately stacking an electrode and a transformable layer. This is because the transformable layer can be formed with a sufficient permittivity by a simple solution casting method without having to be manufactured in a film type.

On the other hand, when a PVDF-based polymer is used, the transformable layer may not be formed by a solution casting method, because its permittivity may not be sufficiently high. However, a sufficient permittivity of the transformable layer, which is formed of a PVDF-based polymer, may be obtained by, for example, at least one of a stretching process and a polling process.

In order to perform such a stretching or polling process, a PVDF-based polymer is manufactured in a separate film using co-extrusion, and the like. Specifically, a film-type PVDF-based polymer can have a sufficient permittivity when its polarization direction is uniformly formed through the stretching or polling process. In other words, the PVDF-based polymer used for the first transformable layer 112 may be manufactured in a film and then subjected to a stretching or polling process. In this instance, the stretching process refers to a process of pulling and orienting a polymer chain in a heated state, and the polling process refers to a process of arranging atoms having particular charges in one direction by applying a high direct current (DC) voltage to the polymer.

For example, when the stretching or polling process is applied to the PVDF-based polymer, a fluorine (F) atom may be arranged at a desired position. Through the stretching or polling process, the first transformable layer 112 may acquire a strong polarization effect. More specifically, the PVDF-based polymer corresponding to a PVDF homo-polymer may be stretched or polled to form the transformable layer. Also, P(VDF-TrFE) (Poly(VinyliDene Fluoride)-trifluoroethylene corresponding to a PVDF co-polymer may be polled to form the transformable layer. As described in the foregoing, the transformable layer including the PVDF-based polymer can be manufactured in a film type to acquire a high permittivity.

A thickness of the first transformable layer 112 may be selected based on various factors such as power consumption, driving voltage for operating the first transformable device 110, and whether a normal operation of the first transformable device 110 can be performed. The thickness of the first transformable layer 112 may be in a range of 10 µm to 300 µm, and more preferably in a range of 50 µm to 150 µm. Herein, when the thickness of the first transformable layer 112 is less than 10 µm, a sufficient voltage may not be applied for a normal operation of the first transformable device 110. In addition, when the thickness of the first transformable layer 112 is greater than 300 µm, an excessive driving voltage may be needed to drive the first transformable device 110, thereby increasing power consumption.

The first transformable layer 112 may expand or contract in response to an electric field applied by the first lower electrode 111 and the first upper electrode 113. In this instance, whether the first transformable layer 112 expands or contracts may be determined according to a polarization direction of the first transformable layer 112 and a direction of an electric field applied to the first transformable layer 112.

For example, the PVDF-based polymer used for the first transformable layer 112 may have a polarization direction determined according to its atom arrangement. That is, the polarization direction is determined according to an arrangement of F atoms having a high electronegativity. For example, when the first transformable layer 112 is disposed such that fluorine (F) atoms are disposed in a lower part and hydrogen (H) atoms including few electrons are disposed in an upper part, the polarization direction of the first transformable layer 112 may become an upward direction toward the second transformable device 130.

The first transformable layer 112 may contract or expand according to the polarization direction of the first transformable layer 112 and the direction of the electric field applied to the first transformable layer 112. For example, the first transformable layer 112 expands when the polarization direction of the first transformable layer 112 is different from the direction of the electric field applied to the first transformable layer 112, while the first transformable layer 112 contracts when the polarization direction of the first transformable layer 112 is the same as the direction of the electric field applied to the first transformable layer 112. Contraction or expansion of the first transformable layer 112 results in a bending of the device in which the transformable device is in contact with a display panel or other substrates.

The first lower electrode 111 and the first upper electrode 113 perform a function of applying an electric field to cause a deformation of the first transformable layer 112. The first lower electrode 111 is disposed on a first (e.g. lower) surface of the first transformable layer 112, and the first upper electrode 113 is disposed on a second (e.g. upper) surface of the first transformable layer 112.

The first lower electrode 111 and the first upper electrode 113 may be made of a conductive material. For example, the first lower electrode 111 and the first upper electrode 113 may be made of a metal material such as gold (Au), copper (Cu), titanium (Ti), chrome (Cr), molybdenum (Mo), aluminum (Al), and an Al—Cu alloy, or a conductive polymer such as PEDOT[Poly(3,4-ethylenedioxythiophene)]:PSS [Poly(4-styrenesulfonic acid)], polypyrrole, and polyaniline. However, the present disclosure is not limited thereto. The first lower electrode 111 and the first upper electrode 113 may be made of the same material or different materials.

In addition, the first lower electrode 111 and the first upper electrode 113 may be configured as soft electrodes. Thus, they are suitable for a smooth, repeated operation and a deformation of the multilayer transformable device 100 including the first transformable layer 112. Such soft electrodes may be manufactured by mixing an elastomer with carbon conductive grease, carbon black, or carbon nanotube.

As thicknesses of the first lower electrode 111 and the first upper electrode 113 increase, a total number of transformable layers which can be included in the multilayer transformable device 100 having a given thickness decreases. Given that a driving displacement of the multilayer transformable device 100 increases as the total number of transformable layers increases, it is preferable that the thicknesses of the first lower electrode 111 and the first upper electrode 113 be as thin as possible in order to dispose as many transformable layers as possible in the multilayer transformable device having a constant thickness. For example, each of the first lower electrode 111 and the first upper electrode 113 preferably has a thickness of 200 nm or less, and more preferably, has a thickness of 100 nm or less. However, the thickness is not limited thereto.

The first lower electrode 111 and the first upper electrode 113 may be disposed on one surface of the first transformable layer 112 using various methods. For example, the first lower electrode 111 and the first upper electrode 113 may be disposed on both surfaces of the first transformable layer 112 by a sputtering, printing, and slit coating method. In particular, when the first lower electrode 111 and the first upper electrode 113 are disposed using the same material, the first lower electrode 111 and the first upper electrode 113 may be simultaneously disposed in the same process.

The first lower electrode 111 and the first upper electrode 113 form an electric field in response to a voltage applied from outside. Here, voltages having different levels or voltages having opposite electric properties may be applied to the first lower electrode 111 and the first upper electrode 113 in order to form an electric field in the first transformable layer 112. For example, a negative voltage or a ground voltage may be applied to the first upper electrode 113 when a positive voltage is applied to the first lower electrode 111, and a positive voltage or a ground voltage may be applied to the first upper electrode 113 when a negative voltage is applied to the first lower electrode 111. Here, when an electric property of a voltage applied to the first lower electrode 111 and an electric property of a voltage applied to the first upper electrode 113 are changed to opposite properties, a direction of an electric field is changed accordingly.

An alternating current (AC) voltage or a DC voltage may be applied to the first lower electrode 111 and the first upper electrode 113. When an AC voltage is applied to the first lower electrode 111 and the first upper electrode 113, the first transformable device 110 may be periodically shifted, and thus, a vibration effect can be obtained. When a DC voltage is applied to the first lower electrode 111 and the first upper electrode 113, the first transformable device 110 may be maintained in a bent state.

The sub-transformable layer 120 is disposed between the first transformable device 110 and the second transformable device 130 to function as a minor electro-active layer which is deformed by an electrical stimulation together with the first transformable layer 112 and the second transformable layer 132. The sub-transformable layer 120 includes a sub-EAP, a type of which is different from that of an EAP included in a transformable layer of an adjacent unit transformable device. The sub-EAP included in the sub-transformable layer 120 may include a silicone-based, urethane-based, or acrylic-based dielectric elastomer, or a ferroelectric polymer such as a PVDF-based polymer. However, the present disclosure is not limited thereto.

For example, the sub-transformable layer 120 may include a ferroelectric polymer when the first transformable device 110 and the second transformable device 130 include a dielectric elastomer, and the sub-transformable layer 120 may include a dielectric elastomer when the first transformable device 110 and the second transformable device 130 include a ferroelectric polymer. When the first transformable device 110 and the second transformable device 130 include an EAP different from that of the sub-transformable layer 120, it is possible to implement a multilayer transformable device having an enhanced driving displacement and a low driving voltage when compared to a conventional multilayer transformable device manufactured using only a dielectric elastomer.

In particular, when the first transformable device 110 and the second transformable device 130 include a PVDF-based polymer as an EAP, it is more preferable that the sub-transformable layer 120 include a dielectric elastomer and a high-dielectric filler as a sub-EAP. When the sub-transformable layer 120 further includes a high-dielectric filler in addition to a dielectric elastomer, the sub-transformable layer 120 has a higher permittivity than that of a conventional dielectric elastomer, and thus a driving displacement of the multilayer transformable device may be enhanced. Hereinafter, a description will be given on the assumption that the sub-transformable layer 120 includes a dielectric elastomer and a high-dielectric filler by way of example.

The sub-transformable layer 120 bonds the first transformable device 110 and the second transformable device 130 together. As described, when the multilayer transformable device is manufactured using only a dielectric elastomer for the transformable layer, the electrode and the transformable layer may be alternately stacked by a solution casting method. However, when the multilayer transformable device is manufactured using a ferroelectric polymer such as a PVDF homo-polymer, a stretching or polling process may need to be performed. Thus, the PVDF-based homo-polymer may not be directly stacked on the electrode as the dielectric elastomer formed by a solution casting method.

In order to manufacture a multilayer transformable device using the PVDF-based polymer, a unit transformable device, in which electrodes are stacked on both surfaces of the PVDF-based polymer film subjected to a stretching or polling process, may be need to be prepared. In addition, an adhesive layer may need to be disposed between unit transformable devices to stack the respective unit transformable devices. However, a conventional optical adhesive such as an acrylic-based adhesive, a polyvinyl alcohol-based adhesive, and a polyurethane-based adhesive has a low permittivity, and has a disadvantage in that performance of the multilayer transformable device is degraded due to a thickness of the optical adhesive. However, as described in the foregoing, when the sub-transformable layer including a dielectric elastomer and a high-dielectric filler is used, performance of a multilayer transformable device including a ferroelectric polymer may be enhanced. In this regard, the sub-transformable layer 120 disposed between the first transformable device 110 and the second transformable device 130 is preferably a high-dielectric adhesive that may function as an adhesive layer in addition to an electro-active layer.

The dielectric elastomer included in the sub-transformable layer 120 may correspond to at least one selected from the group including an acrylic-based polymer, a urethane-based polymer, and a silicone-based polymer. However, the dielectric elastomer is not limited thereto. In particular, the dielectric elastomer of the present embodiment may preferably be a silicone-based polymer, for example, polydimethyl siloxane (PDMS) which can provide a sufficient adhesive strength and operate in a wide temperature range.

The dielectric elastomer may preferably correspond to a compound having a great polarity, that is, a great permittivity in order to obtain a great deformation with a small driving voltage. For example, it is preferable that a relative permittivity measured at 1 kHz be greater than or equal to 2.5.

The dielectric elastomer may be a polymer having a weight-average molecular weight of 10,000 g/mol or more considering a mechanical property required for the multilayer transformable device 100.

Subsequently, the high-dielectric filler may preferably include at least one selected from the group including piezoelectric ceramics, carbon nanoparticles, metal nanoparticles, and a conductive polymer as a material that can enhance a permittivity of the sub-transformable layer 120 by being mixed with the dielectric elastomer. However, the high-dielectric filler is not limited thereto.

Piezoelectric ceramics may preferably include a piezoelectric metal oxide including a metal atom such as lead (Pb), zirconium (Zr), titanium (Ti), and barium (Ba). For example, piezoelectric ceramics may correspond to perovskite-type oxides including $PbZrO_3$—$PbTiO_3$ (PZT) or barium titanate ($BaTiO_3$). However, the piezoelectric ceramics is not limited thereto.

The carbon nanoparticles may preferably include at least one selected from the group consisting of a single-walled carbon nanotube (SWCNT), a double-walled carbon nanotube (DWCNT), a multi-walled carbon nanotube (MWCNT), graphene, graphite, carbon black, carbon fiber, and fullerene. In particular, the SWCNT is more preferable in that the permittivity of the sub-transformable layer 120 is greatly enhanced in a low-frequency region. However, the carbon nanoparticles are not particularly limited.

The metal nanoparticles may correspond to a nanowire, a nanorod, a nanopore, or a nanotube including gold (Au) or silver (Ag). However, the metal nanoparticles are not particularly limited.

The conductive polymer preferably includes at least one selected from the group including polyfluorene, polyphenylene, polypyrene, polyazulene, polynaphthalene, polyacetylene (PAC), poly(p-phenylene vinylene) (PPV), polypyrrole (PPY), polycarbazole, polyindole, polyazepine, poly(thienylene vinylene), poly(thienylene vinylene), polyaniline (PANI), poly(thiophene), poly(p-phenylene sulfide) (PPS), poly(3,4-ethylenedioxy thiophene (PEDOT), poly(3,4-ethylenedioxy thiophene) doped with poly(styrene sulfonate) (PSS)) (PEDOT:PSS), poly(3,4-ethylenedioxy thiophene)-tetramethacrylate (PEDOT-TMA), and polyfuran. However, the conductive polymer is not particularly limited.

The conductive polymer may preferably have a conductivity of $10^{-6}$ S/cm or more, and more preferably have a conductivity of $10^{-2}$ S/cm or more. When the conductivity of the conductive polymer is higher than $10^{-6}$ S/cm, the permittivity of the sub-transformable layer 120 may be enhanced by interaction with the dielectric elastomer.

In the sub-transformable layer 120, a weight ratio of the dielectric elastomer to the high-dielectric filler may preferably be in a range of 99:1 to 50:50, and more preferably in a range of 90:10 to 60:40. When a contained quantity of the high-dielectric filler is below 1%, enhancement of the permittivity of the sub-transformable layer 120 may be inadequate, and the sub-transformable layer 120 may have difficulty in functioning as another transformable layer. On the other hand, when the contained quantity of the high-dielectric filler exceeds 50%, permittivity enhancement effect may be saturated or degraded. Moreover, when the contained quantity of the high-dielectric filler, which is present in a form of particles, increases, an adhesive strength of the sub-transformable layer 120 may be degraded.

The sub-transformable layer 120 may preferably have a permittivity of 5.0 or more, and more preferably have the permittivity of 7.0 or more when the permittivity is measured at 1 kHz. In general, PDMS, which is widely used as the dielectric elastomer, has a permittivity in a range of about 2.5 to 3.0. However, when the high-dielectric filler is used, the permittivity can be increased to 7.0 or more, and preferably increased to 9.0 or more.

The sub-transformable layer 120 may preferably have an adhesive strength of 1500 gf/inch or more, i.e. 579 N/m or more, and more preferably have an adhesive strength of 1800 gf/inch or more, i.e. 695 N/m or more, when the adhesive strength is measured using a tensile strength meter. If the adhesive strength of the sub-transformable layer 120 is higher than 579 N/m, an adhesive state between the unit transformable devices 110 and 130 may be maintained even when the multilayer transformable device 100 is deformed.

The sub-transformable layer 120 may preferably have a thickness in a range of 1 μm to 300 μm, and more preferably have a thickness in a range of 10 μm to 150 μm. When the thickness of the sub-transformable layer 120 is below 1 μm, enhancement effect of the driving displacement of the multilayer transformable device 100 may be inadequate. On the other hand, when the thickness of the sub-transformable layer 120 exceeds 300 μm, a thickness of the multilayer transformable device 100 may increase, and thus the driving displacement may be degraded, and a weight of the multilayer transformable device 100 may greatly increase.

The sub-transformable layer 120 is disposed between the first transformable device 110 and the second transformable device 130. Thus, a first or lower surface of the sub-transformable layer 120 comes into contact with the second electrode 113 of the first transformable device 110 (first upper electrode 113), and a second or upper surface of the sub-transformable layer 120 comes into contact with the first electrode 131 of the second transformable device 130 (second lower electrode 131). In other words, a coulombic force is generated due to an electric field between the first upper electrode 113 of the first transformable device 110 and the second lower electrode 131 of the second transformable device 130, and thus a Maxwell stress is applied to the sub-transformable layer 120 including the dielectric elastomer and the high-dielectric filler. In this instance, Equation 1 below expresses a magnitude of Maxwell stress:

$$\text{Maxwell Stress}(P) = \varepsilon_r \varepsilon_o E^2 = \varepsilon_r \varepsilon_o \left(\frac{V}{t}\right)^2 \qquad \text{[Equation 1]}$$

($\varepsilon_o$: space permittivity in vacuum, $\varepsilon_r$: relative permittivity, E: electric field, V: voltage, t: thickness of transformable layer).

Here, the Maxwell stress refers to a force applied such that the sub-transformable layer 120 contracts in a thickness direction and expands in a length direction. Referring to Equation 1, the magnitude (P) of Maxwell stress is proportional to a relative permittivity ($\varepsilon_r$), an electric field (E), and a voltage (V). When the magnitude of Maxwell stress increases, the sub-transformable layer 120 has a greater displacement or is more greatly deformed.

The sub-transformable layer 120 has a high permittivity. From Equation 1, given that the Maxwell stress is proportional to permittivity, the sub-transformable layer 120 having a high permittivity may function as another electroactive layer. In other words, in addition to the first transformable layer 112 and the second transformable layer 132 included in the multilayer transformable device 100, the sub-transformable layer 120 may also contract or expand by the electrodes formed in the transformable device.

In this instance, voltages having different levels or voltages having opposite electrical properties are applied to the first lower electrode 111 and the first upper electrode 113 of the first transformable device 110 and the second lower electrode 131 and the second upper electrode 133 of the second transformable device 130. For example, a positive voltage and a negative voltage are alternately applied to the electrodes 111, 113, 131, and 133 of the unit transformable devices 110 and 130. For example, a positive voltage is applied to the first lower electrode 111 of the first transformable device 110, a negative voltage is applied to the first upper electrode 113 of the first transformable device 110, a positive voltage is again applied to the second lower electrode 131 of the second transformable device 130, and a negative voltage is again applied to the second upper electrode 133 of the second transformable device 130. In this case, the sub-transformable layer 120 may be shifted by an electrostatic attraction generated due to the negative voltage applied to the first upper electrode 113 of the first transformable device 110 and the positive voltage applied to the second lower electrode 131 of the second transformable device 130.

The sub-transformable layer 120 preferably contracts or expands in the same direction as that of the first transformable layer 112 and the second transformable layer 132. However, the present disclosure is not limited thereto. In general, the multilayer transformable device 100 is bonded with a substrate of the display panel, and the like to implement a bending of the completed device. In this case, the bending ability of the completed device may be maximized when a contraction or expansion direction of the first transformable layer 112 and the second transformable layer 132 is the same as that of the sub-transformable layer 120. In this instance, as described above, the contraction or expansion of the PVDF-based polymer may be adjusted according to a polarization direction and a direction of an applied electric field. Thus, for example, when the sub-transformable layer 120 expands in a length direction in response to an applied electric field, the first transformable layer 112 and the second transformable layer 132 may expand in length directions simultaneously with the sub-transformable layer 120 if the first transformable layer 112 and the second transformable layer 132 are configured to have different polarization directions and different directions of applied electric fields.

Meanwhile, the second transformable device 130 is disposed on the sub-transformable layer 120. The second transformable device 130 is a unit transformable device included in the multilayer transformable device 100, and implements vibration or bending by being deformed by a voltage applied to the second lower electrode 131 and the second upper electrode 133.

Each of the second transformable layer 132, the second lower electrode 131, and the second upper electrode 133 included in the second transformable device 130 may be configured to be the same as each of the first transformable layer 112, the first lower electrode 111, and the first upper electrode 113 included in the first transformable device 110. Respective specific configurations and effects of the second transformable device 130 are the same as those of the first transformable device 110, and thus repeated description will be omitted.

The multilayer transformable device 100 according to the present embodiment may include the sub-transformable layer 120 including the dielectric elastomer and the high-dielectric filler between the unit transformable devices 110 and 130 including the PVDF-based polymer as transformable layers.

An adhesive layer may be needed to form a transformable device using the PVDF-based polymer as a transformable layer in a multilayer structure. A conventionally used adhesive layer has a low permittivity. In particular, a permittivity of an optical clear adhesive (OCA) measured at 1 kHz is 3.0 or less. As described above, the conventional adhesive layer has a low permittivity, and thus may be used only for adhesion. The adhesive layer increases a thickness of a transformable device, which may impede driving displacement of the transformable device.

However, the sub-transformable layer 120 is an adhesive layer having an excellent permittivity based on the dielectric elastomer. Thus, the sub-transformable layer 120 functions not only as an adhesive but also as a transformable layer by an electrostatic attraction caused by the electrodes which come into contact with both surfaces of the sub-transformable layer 120.

As a result, the sub-transformable layer 120 may be deformed together with the first transformable device 110 and the second transformable device 130 when the first transformable device 110 and the second transformable device 130 are deformed while being interposed between the first transformable device 110 and the second transformable device 130. Also, the multilayer transformable device 100 according to the present embodiment uses the sub-transformable layer 120 having a high permittivity, instead of the conventional adhesive, as well as the PVDF-based polymer having a higher permittivity than that of the dielectric elastomer, thereby enhancing an amount of driving displacement. Furthermore, since a total permittivity of the multilayer transformable device 100 is enhanced, a driving voltage of the multilayer transformable device 100 can be decreased.

Figure 2:
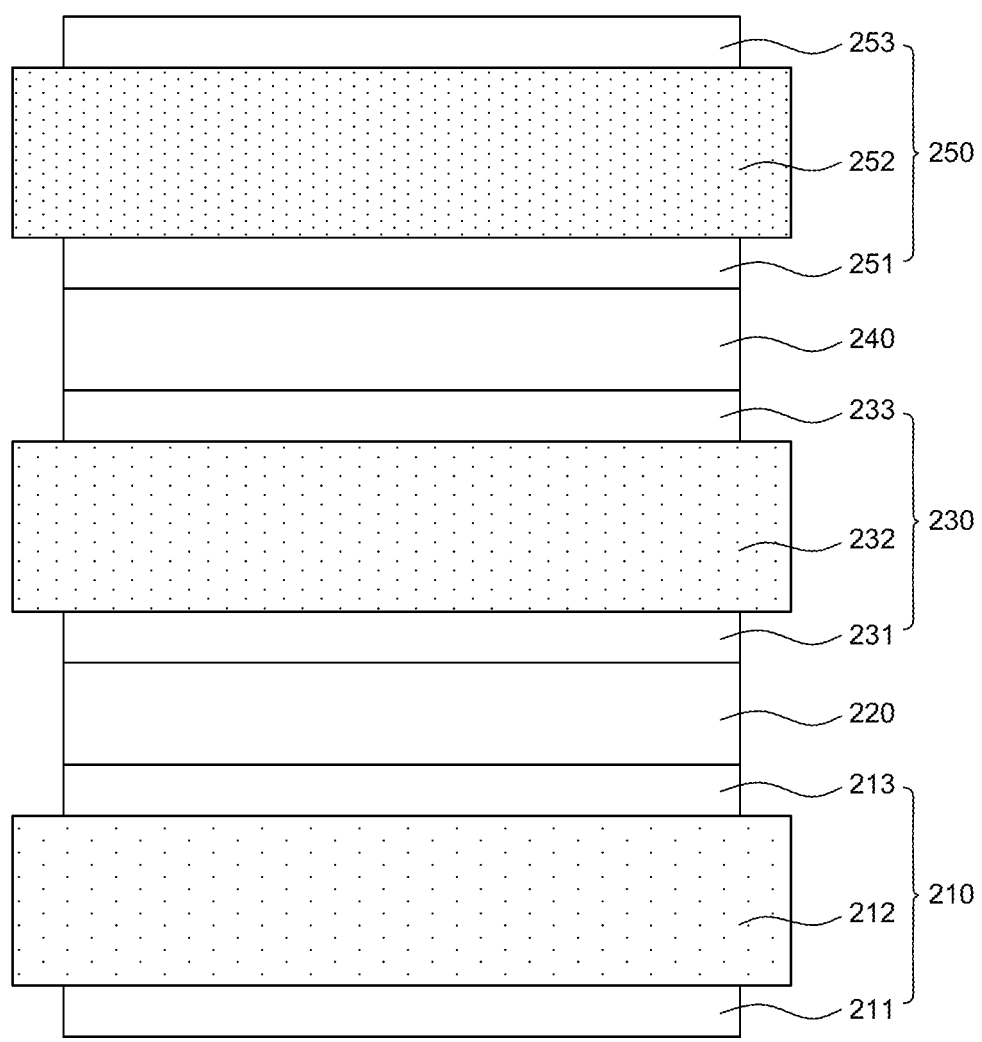
FIG. 2 is a schematic cross-sectional view illustrating a multilayer transformable device according to another embodiment of the present disclosure.

FIG. 2 is a schematic cross-sectional view illustrating a multilayer transformable device 200 according to another embodiment of the present disclosure.

Referring to FIG. 2, the multilayer transformable device 200 according to present embodiment includes a first transformable device 210 having a first transformable layer 212, a first lower electrode 211, and a first upper electrode 213, a first sub-transformable layer 220 disposed on the first transformable device 210, a second transformable device 230 which is disposed on the first sub-transformable layer 220 and has a second transformable layer 232, a second lower electrode 231, and a second upper electrode 233, a second sub-transformable layer 240 disposed on the second transformable device 230, and a third transformable device 250 which is disposed on the second sub-transformable layer 240 and has a third transformable layer 252, a third lower electrode 251, and a third upper electrode 253.

The multilayer transformable device 200 of FIG. 2 is different from the multilayer transformable device 100 of FIG. 1 in that the multilayer transformable device 200 has a configuration in which three unit transformable devices are stacked. In other words, the multilayer transformable device 200 according to the present embodiment may include two or more unit transformable devices, and a separate sub-transformable layer may be disposed respectively between the respective unit transformable devices.

In the multilayer transformable device 200, the first transformable layer 212, the second transformable layer 232, and the third transformable layer 252, which are respectively included in the unit transformable devices 210, 230, and 250, include a different type of EAP from that of the first sub-transformable layer 220 and the second sub-transformable layer 240.

In this instance, the multilayer transformable device 200 has substantially the same configuration as that of the multilayer transformable device 100 of FIG. 1, except that the third transformable device 250 and the second sub-transformable layer 240 are further included, and thus a repeated description will be omitted.

In the multilayer transformable device 200, the second sub-transformable layer 240 is disposed on the second transformable device 230. Similar to the first sub-transformable layer 220, the second sub-transformable layer 240 includes a different type of EAP from that of a transformable layer of an adjacent unit transformable device. The second sub-transformable layer 240 may have the same configuration as that of the sub-transformable layer 120 of FIG. 1.

The third transformable device 250 is disposed on the second sub-transformable layer 240. The third transformable device 250 may have the same configuration as that of at least one of the first transformable device 210 and the second transformable device 230.

In the multilayer transformable device 200, voltages having different electrical properties are alternately applied to the first lower electrode 211 and the first upper electrode 213 of the first transformable device 210, the second lower electrode 231 and the second upper electrode 233 of the second transformable device 230, and third lower electrode 251 and the third upper electrode 253 of the third transformable device 250. In this case, each of the first sub-transformable layer 220 and the second sub-transformable layer 240 is deformed by an electric field generated by the electrodes coming into contact with both surfaces.

As a result, in the multilayer transformable device 200, the respective unit transformable devices 210, 230, and 250, the first sub-transformable layer 220, and the second sub-transformable layer 240 are deformed together by applied voltages. Thus, the multilayer transformable device 200 has a greater driving displacement than that of a multilayer transformable device manufactured only using the dielectric elastomer or a multilayer transformable device including a conventional adhesive layer having a low permittivity.

Hereinafter, the present disclosure will be described in more detail with exemplary embodiments. However, the exemplary embodiments set forth below are merely provided to show examples of the present disclosure, and the scope of the present disclosure is not restricted by the exemplary embodiments.

Multilayer transformable devices of Example 1 and Comparative Examples 1 to 3 were manufactured by varying a transformable layer and a sub-transformable layer (adhesive layer).

Example 1

A first transformable layer and a second transformable layer, each of which has a thickness of 80 μm, were prepared by performing a lamination after stretching a PVDF homo-polymer, and metal electrodes (carbon conductive grease) were deposited on both surfaces of each of the transformable layers, thereby manufacturing a first transformable device and a second transformable device, each of which has a configuration of lower electrode/transformable layer/upper electrode. Thereafter, PDMS as a dielectric elastomer and barium titanate (diameter of particle: 120 nm, measured by SEM) as a high-dielectric filler were added to hexane corresponding to a solvent, thereby manufacturing a mixture solution. In this instance, a weight ratio of PDMS to barium titanate was 60:40. An upper electrode of the first transformable device was coated with the manufactured solution to form a sub-transformable layer (adhesive layer) having a thickness of 50 μm, and then a second transformable device was joined thereto, thereby manufacturing the multilayer transformable device of Example 1.

Comparative Example 1

The multilayer transformable device of Comparative Example 1 was manufactured using the same method as that of Example 1, except that a first transformable layer and a second transformable layer including only PDMS were formed instead of using the PVDF homo-polymer.

Comparative Example 2

A sub-transformable layer and the multilayer transformable device of Comparative Example 2 were manufactured using the same method as that of Example 1, except that a substrate was coated with a mixture solution obtained by adding PDMS as a dielectric elastomer and barium titanate (diameter of particle: 120 nm, measured by SEM) as a high-dielectric filler to hexane corresponding to a solvent at a weight ratio of 60:40 instead of using the PVDF homo-polymer and dried to obtain a first transformable layer and a second transformable layer, each of which has a thickness of 80 μm, and then metal electrodes (carbon conductive grease) were deposited on both surfaces of each of the manufactured transformable layers, thereby manufacturing a first transformable device and a second transformable device including PDMS and the high-dielectric filler.

Comparative Example 3

The multilayer transformable device of Comparative Example 3 was manufacturing using the same method as that of Example 1, except that a sub-transformable layer (adhesive layer) was formed using a conventional acrylic-based OCA adhesive instead of the mixture solution of PDMS and barium titanate manufactured in Example 1.

Experiments below were conducted to obtain properties including driving displacement levels of the manufactured multilayer transformable devices of Example 1 and Comparative Examples 1 to 3.

Experimental Example 1—Measurement of Permittivity of Sub-Transformable Layer

A capacitance at a frequency of 1 kHz was measured using an LCR meter (4284A), and permittivities of sub-transformable layers of the multilayer transformable devices manufactured according to Example 1 and Comparative Examples 1 to 3 were calculated using Equation 2 below and measured. A result of the measurement is shown in Table 1 below.

$$\epsilon = C \times t / \epsilon_0 \times A \qquad \text{[Equation 2]}$$

($\epsilon$: permittivity, C: capacitance, $\epsilon_0$: permittivity in vacuum, t: thickness of transformable layer, A: contact cross-sectional area)

Experimental Example 2—Measurement of Adhesive Strength of Sub-Transformable Layer Adhesive strengths of sub-transformable layers of the multilayer transformable devices manufactured according to Example 1 and Comparative Examples 1 to 3 were measured using a tensile strength meter (Tinius Olsen, Ltd., H5KT UTM). A result of the measurement is listed in Table 1 below.

Experimental Example 3—Measurement of Driving Displacement of Transformable Device To measure driving displacements of the multilayer transformable devices manufactured according to Example 1 and Comparative Examples 1 to 3, each of a maximum radius curvature and a minimum radius curvature was measured under a condition of 2.4 kVpp using a laser device (Keyenece, Ltd., LK-G80), and then a radius curvature change value was calculated, thereby obtaining bending ability. A result of the measurement is listed in Table 1 below.

TABLE 1

| Division | Configuration of transformable layer/subtransformable layer | | | Permittivity of sub-transformable layer (at 1 kHz) | Adhesive strength of sub-transformable layer (gf/inch) | Minimum radius curvature (mm) | Maximum radius curvature (mm) | Radius curvature change value (mm) |
|---|---|---|---|---|---|---|---|---|
| | First transformable layer | Sub-transformable layer | second transformable layer | | | | | |
| Example 1 | Homo-PVDF | PDMS + barium titanate | Homo-PVDF | 8.5 | 1850 (714 N/m) | 629 | 1875 | 1246 |
| Comparative Example 1 | PDMS | PDMS + barium titanate | PDMS | 8.5 | 1850 (714 N/m) | 1322 | 1396 | 74 |
| Comparative Example 2 | PDMS + barium titanate | PDMS + barium titanate | PDMS + barium titanate | 8.5 | 1850 (714 N/m) | 1039 | 1543 | 504 |
| Comparative Example 3 | Homo-PVDF | Acrylic OCA | Homo-PVDF | 3.5 | 2015 (778 N/m) | 943 | 1632 | 689 |

Table 1 indicates that the multilayer transformable device of Example 1, in which different types of EAPs are alternately stacked, has an excellent driving displacement. In particular, the comparison between Example 1 and Comparative Example 1 indicates that a conventional multilayer transformable device having a configuration in which only a dielectric elastomer is stacked has a significantly small driving displacement.

In addition, the comparison between Example 1 and Comparative Example 2 indicates that the multilayer transformable device of Example 1 has a significantly great radius curvature change at the same voltage when compared to the multilayer transformable device of Comparative Example 2 in which all the first transformable layer, the second transformable layer, and the sub-transformable layer include the dielectric elastomer and the high-dielectric filler. In other words, it can be understood that the multilayer transformable device of Example 1 has far superior performance when compared to a multilayer transformable device formed by simply stacking a plurality of layers of an elastomer having a high permittivity.

Meanwhile, the comparison between Example 1 and Comparative Example 3 indicates that the permittivity of the sub-transformable layer of Example 1 was a remarkably enhanced when compared to the permittivity of the sub-transformable layer of Comparative Example 3 which uses a conventional adhesive, and thus a driving voltage of the multilayer transformable device decreased. More specifically, the comparison indicates that the multilayer transformable device of Example 1 has a radius curvature change which is twice as great as that of the multilayer transformable device of Comparative Example 3 at the same voltage.

In other words, it can be understood that a degree of bending of the multilayer transformable device is greatly enhanced due to an excellent permittivity of the sub-transformable layer.

As described above, the sub-transformable layer including the dielectric elastomer and the high-dielectric filler used to bond the first transformable device and the second transformable device including the PVDF-based polymer together has a significantly high permittivity when compared to the conventional optical adhesive. In Example 1, the sub-transformable layer also functions as a transformable layer in addition to its adhesive function. Hence, when the first transformable device and the second transformable device are bonded together using the sub-transformable layer, the multilayer transformable device may have a greatly enhanced bending ability, that is, a greatly enhanced driving displacement, and have a decreased driving voltage.

In this way, when a multilayer transformable device is manufactured by bonding unit transformable devices, which use transformable layers including the PVDF-based polymer among ferroelectric polymers, together using the sub-transformable layer, it is possible to obtain a multilayer transformable device having an enhanced driving displacement.

Figure 3:
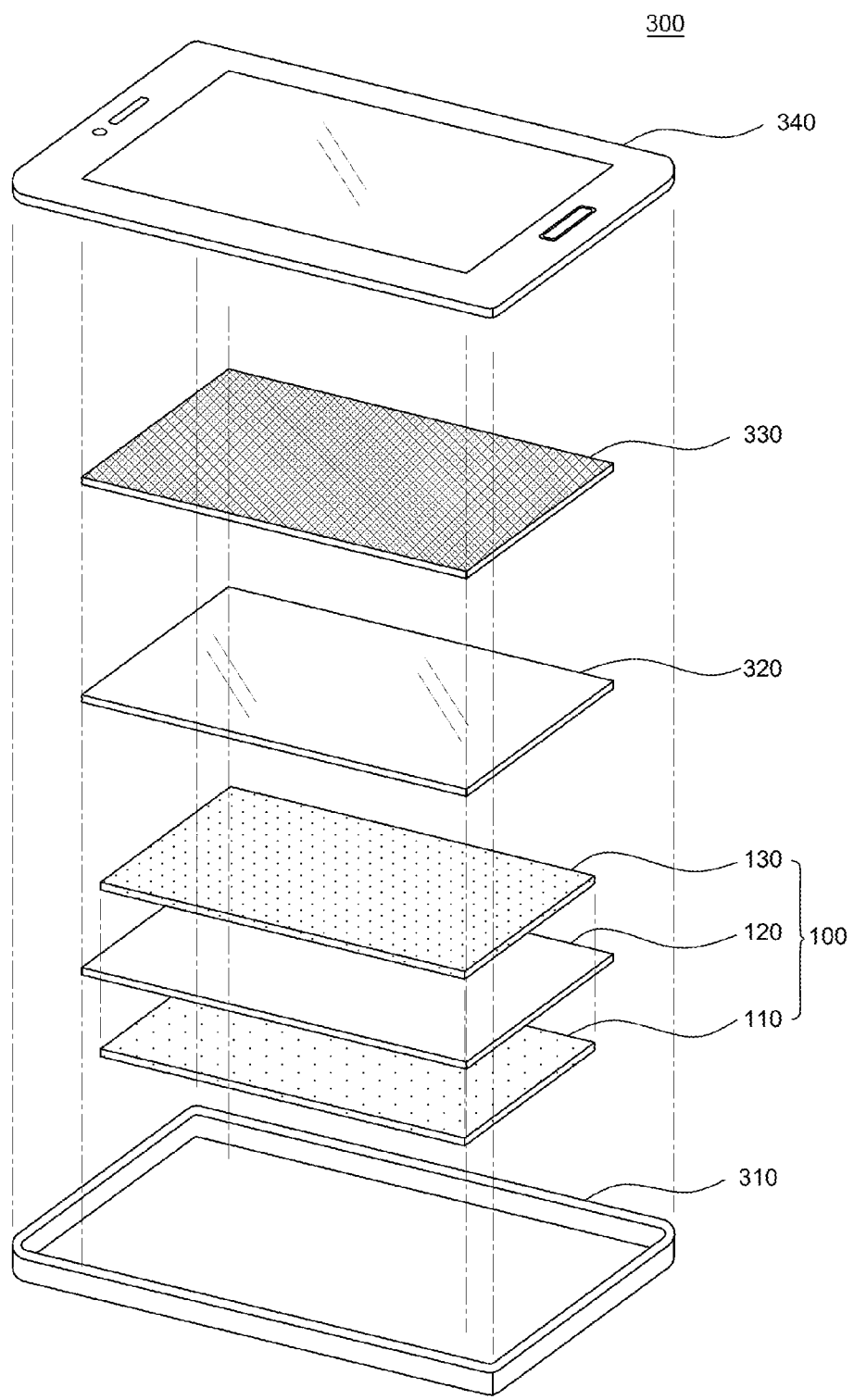
FIG. 3 is a schematic exploded perspective view illustrating a display device including a multilayer transformable device according to an embodiment of the present disclosure.

FIG. 3 is a schematic exploded perspective view illustrating a display device 300 including a multilayer transformable device according to an embodiment of the present disclosure.

Referring to FIG. 3, the display device 300 according to the present embodiment includes a lower cover 310, a multilayer transformable device 100, a display panel 320, a touch panel 330, and an upper cover 340.

The lower cover 310 is disposed below the multilayer transformable device 100 to cover lower portions of the multilayer transformable device 100, the display panel 320, and the touch panel 330. The lower cover 310 protects internal components of the display device 300 from an external shock and a permeation of water or a foreign material. The lower cover 310 may be made of a material which can be deformed together in response to a change in a shape of the multilayer transformable device 100. For example, the lower cover 310 may be made of a material such as plastic having ductility. However, the lower cover 310 is not limited thereto.

The multilayer transformable device 100 may be disposed below the display panel 320. Specifically, the multilayer transformable device 100 may be disposed to directly come into contact with a surface of the display panel 320, or disposed using an adhesive between a surface of the display panel 320 and a surface of the multilayer transformable device 100. Examples of the adhesive may include an optical clear adhesive (OCA) or an optical clear resin (OCR). However, the adhesive is not limited thereto. The multilayer transformable device 100 may be disposed on the lower cover 310.

The multilayer transformable device 100 illustrated in FIG. 3 includes a first transformable device 110, a second transformable device 130, and a sub-transformable layer 120 disposed between the first transformable device 110 and the second transformable device 130. In other words, the multilayer transformable device 100 may have the same configuration as that of one of the multilayer transformable devices 100 and 200 illustrated in FIGS. 1 and 2, respectively.

The sub-transformable layer 120 includes a different type of sub-EAP from that of an EAP included in transformable layers of adjacent unit transformable devices. The sub-transformable layer 120 has an excellent permittivity, and thus may function as a transformable layer in addition to a function of bonding the first transformable device 110 and the second transformable device 130 together. As a result, the multilayer transformable device 100 may have a further enhanced bending ability and a decreased driving voltage.

The multilayer transformable device 100 may be electrically connected to the display panel 320. For example, a flexible printed circuit board (FPCB) disposed on the display panel 320 and an electrode of the multilayer transformable device 100 may be electrically connected to each other through a wire.

The display panel 320 refers to a panel including a display element for displaying an image on the display device 300. For example, various display panels such as an organic light-emitting display panel, a liquid crystal display panel, and an electrophoresis display panel may be used as the display panel 320.

The organic light-emitting display device is a display device that allows a current to flow in an organic light-emitting layer such that the organic light-emitting layer emits light having a particular wavelength. The organic light-emitting display device includes at least a cathode, the organic light-emitting layer, and an anode. The transformable device 100 disposed below the display panel 320 may be deformed with flexibility, and thus the organic light-emitting display device may be configured to be deformed with flexibility. In other words, the organic light-emitting display device is a flexible organic light-emitting display device having flexibility, and includes a flexible substrate. The flexible organic light-emitting display device may be deformed in various directions and at various angles by a force applied from outside. Hereinafter, a description will be given on the assumption that the display panel 320 is configured as a flexible organic light-emitting display device by way of example.

The multilayer transformable device 100 disposed below the display panel 320 may be deformed with ductility, and thus the organic light-emitting display device may be configured to be deformed with ductility. In other words, the organic light-emitting display device is a flexible organic light-emitting display device having ductility, and includes a flexible substrate. The flexible organic light-emitting display device may be deformed in various directions and at various angles by a force applied from outside.

The touch panel 330 is disposed on the display panel 320. The touch panel 330 refers to a panel that detects a touch input to the display device 300 by a user and performs a function of providing touch coordinates.

The touch panel 330 may be divided according to a disposed position. For example, it is possible to use an add-on scheme in which the touch panel 330 is attached to an upper surface of the display panel 320, an on-cell scheme in which the touch panel 330 is deposited on the display panel 320, an in-cell scheme in which the touch panel 330 is formed in the display panel 320, and the like. In addition, the touch panel 330 may be divided according to an operation scheme. For example, it is possible to use a capacitive touch panel, a resistive touch panel, an ultrasonic touch panel, an infrared touch panel, and the like. The capacitive touch panel may be preferably used as the touch panel 330.

In addition, the touch panel 330 may be electrically connected to the multilayer transformable device 100. Specifically, the touch panel 330 may be electrically connected to electrodes of the multilayer transformable device 100 such that various touch signals or voltages input by the touch panel 330 may be delivered to the multilayer transformable device 100. Also, the touch panel 330 may be flexible in order to be deformed together with the multilayer transformable device 100.

The upper cover 340 is disposed on the touch panel 330 to cover upper portions of the multilayer transformable device 100, the display panel 320, and the touch panel 330. The upper cover 340 may function similarly to the lower cover 310. In addition, the upper cover 340 may be made of the same material as that of the lower cover 310. In particular, the upper cover 340 may be made of a material having ductility so as to be deformed together with the touch panel 330 and the display panel 320 which may be deformed into various shapes by the multilayer transformable device 100. For example, the upper cover 340 may be made of a material such as plastic having ductility, but is not limited thereto.

The display device 300 is deformed together with the multilayer transformable device 100 in response to a voltage applied to the multilayer transformable device 100. In other words, the display panel 320 and the touch panel 330 joined to the multilayer transformable device 100 are deformed together when the first transformable device 110, the second transformable device 130, and the sub-transformable layer 120 included in the multilayer transformable device 100 are deformed. Hence, the display device 300 can be deformed.

In the display device 300 according to the present embodiment, the multilayer transformable device 100, the display panel 320, and the touch panel 330 may be combined into one unit, and the display device 300 may be deformed into various shapes by the multilayer transformable device 100. A deformed appearance of the display device 300 due to deformation of the multilayer transformable device 100 will now be described with reference to FIG. 4.

Figure 4:
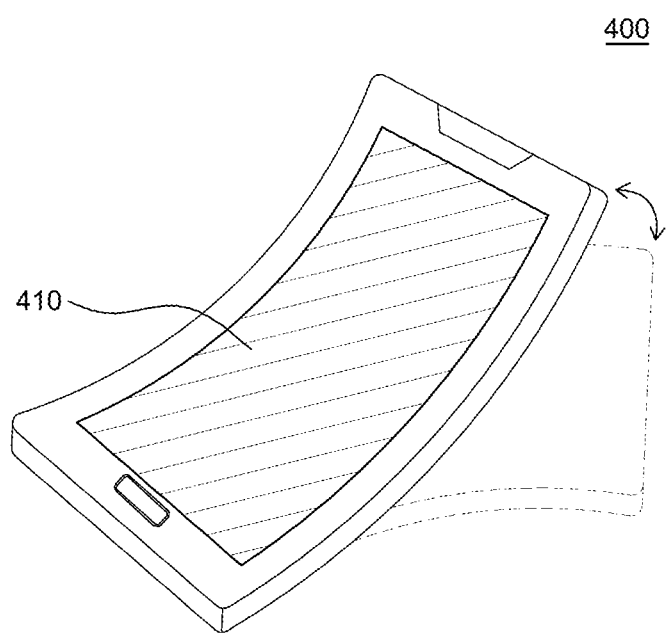
FIG. 4 is a diagram illustrating a deformed shape of a display device according to an embodiment of the present disclosure.

FIG. 4 is a diagram illustrating a state of a display device 400 including a multilayer transformable device according to an embodiment of the present disclosure. In FIG. 4, a description will be given on the assumption that the display device 400 is a smartphone by way of example.

Referring to FIG. 4, a portion of the display device 400 may be bent upward or downward. Specifically, in the display device 400, a multilayer transformable device is attached to a lower portion of a display screen 410, and the multilayer transformable device and the display device 400 are deformed when the multilayer transformable device is driven. In other words, when a portion of the multilayer transformable device is bent upward or downward, a portion of the display device 400 may be bent upward or downward.

Here, when the portion of the multilayer transformable device is periodically bent upward or downward, the portion of the display device 400 may be bent upward or downward accordingly. In addition, when the portion of the multilayer transformable device remains bent upward or downward, the portion of the display device 400 may remain bent upward or downward accordingly.

For example, as an output in response to a touch input to the display device 400 by a user, a portion of the display device 400 may be bent upward or downward. That is, when the display device 400 receives a message or a voice call, a portion of the display device 400 may be bent upward or downward as an output in response to the received message or voice call.

A bent portion, a bending direction, a bending time, a period of change of a bending direction, and the like of the display device 400 may be variously set through the display device 400. In other words, a change in a shape of the display device 400 may be variously set by the user by controlling the multilayer transformable device, and is not limited to the above-mentioned example of shape change.

In the display device 400, the multilayer transformable device can be deformed into different shapes in response to various inputs. Specifically, a bent portion, a bending direction, a bending time, a period of change of a bending direction, and the like may be differently set for each input to the display device 400. As a result, the display device 400 can be deformed into various shapes by controlling the multilayer transformable device, thereby providing the user with various types of outputs.

Figure 5A:
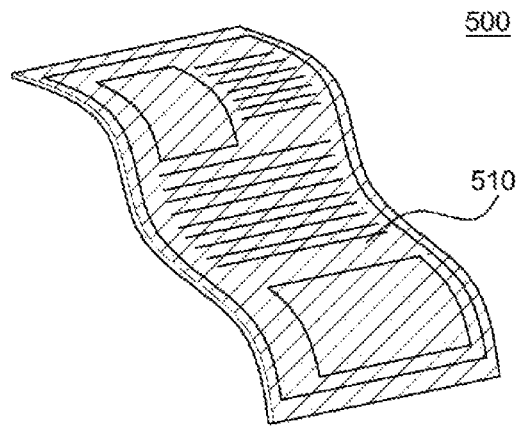
FIGS. 5a, 5b, and 5c are diagrams illustrating examples in which display devices according to various embodiments of the present disclosure can be advantageously used.
Figure 5B:
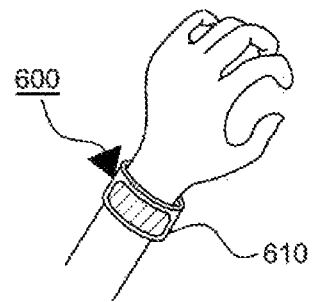
Figure 5C:
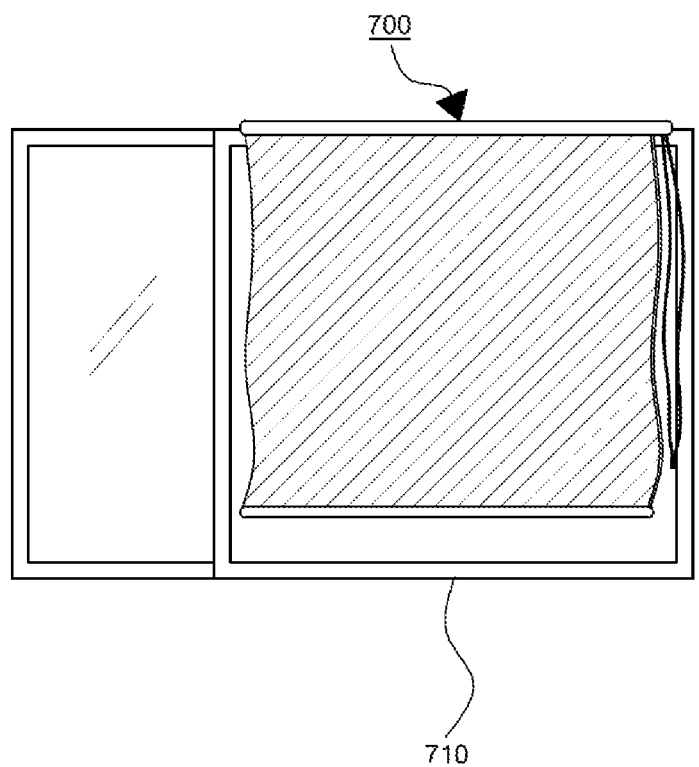

FIGS. 5*a*, 5*b*, and 5*c* are diagrams illustrating examples in which multilayer transformable devices according to various embodiments of the present disclosure can be advantageously used.

FIG. 5*a* is a diagram illustrating an appearance of an electronic newspaper 500 including a multilayer transformable device according to an embodiment of the present disclosure.

Referring to FIG. 5*a*, the electronic newspaper 500 includes a display panel 510 and a multilayer transformable device which is attached to a lower portion of the display panel 510.

The electronic newspaper 500 may provide a feeling of actually reading a newspaper through the multilayer transformable device. When a signal for turning a page is input through the display panel 510 of the electronic newspaper 500, a portion of the multilayer transformable device receiving the input of the signal may be deformed. In this way, a portion of the electronic newspaper 500 may be temporarily bent due to the multilayer transformable device being deformed, and thus a feeling of turning a page as a newspaper may be provided.

In addition, when a new article is uploaded and displayed on the electronic newspaper 500 that includes the multilayer transformable device according to the present embodiment, a portion of the electronic newspaper 500 is deformed, thereby providing an output to the user that the article is uploaded. For example, when an article having a new headline is uploaded, a portion of the multilayer transformable device including the uploaded article is deformed, thereby immediately providing an output to the user that the article is uploaded.

FIG. 5*b* is a diagram illustrating a watch 600 including a multilayer transformable device according to an embodiment of the present disclosure.

Referring to FIG. 5*b*, the watch 600 includes a display panel 610 and a multilayer transformable device which is attached to a lower portion of the display panel 610. Here, a description will be given on the assumption that the watch 600 is a smart watch by way of example.

Various functions of the watch 600 may be implemented by the multilayer transformable device. General time information is displayed through the display panel 610 of the watch 600. In addition, weather, news, and the like may be displayed through the display panel 610 of the watch 600. Further, the watch 600 may include a simple call function, and determine a heart rate of the user wearing the watch 600. Here, the multilayer transformable device in the watch 600 may be contracted to tell time every hour or at a designated alarm time. In this way, a time information may be provided to the user by providing a pressure to the wrist of the user. In addition, the multilayer transformable device in the watch 600 may be contracted when a new weather information or news is displayed, or a protrusion may be formed on a portion of the display panel 610 of the watch 600 when a call is received, thereby providing these information to the user. Further, when a heart rate of the user measured through a portion of the watch 600 reaches a dangerous level, the multilayer transformable device in the watch 600 may be contracted or deformed, thereby providing a warning alarm to the user.

FIG. 5*c* is a diagram illustrating a curtain 700 that includes a multilayer transformable device according to an embodiment of the present disclosure.

Referring to FIG. 5*c*, the curtain 700 includes a display panel 710 and a multilayer transformable device which is attached to a lower portion of the display panel 710.

In the curtain 700, an information on an external environment may be expressed in various manners due to the multilayer transformable device. Specifically, an outside weather may be displayed as a predetermined image through the display panel 710 of the curtain 700, and a specific state of weather may be expressed by changing a shape of the curtain 700.

For example, when a wind blows in a cloudy weather, a cloud may be displayed through the display panel 710 of the curtain 700, a portion of the curtain 700 may be bent due to the multilayer transformable device according to a wind direction and a wind speed, and an area of the bent portion may vary. In other words, a direction in which the curtain 700 may be actually folded or swing according to the wind direction may be expressed as a bending direction of the curtain 700, and an area of the bent portion of the curtain 700 may increase as a wind strength increases. In addition, when an intensity of the light entering through a window becomes less than or equal to a certain level, the curtain 700 may be automatically rolled up or folded in a left or right direction.

As described above, an embodiment of the present disclosure can enhance a bending ability of a multilayer transformable device by alternately disposing different types of EAPs.

Also, an embodiment of the present disclosure may decrease a driving voltage of a multilayer transformable device in which a transformable layer having a high permittivity and a sub-transformable layer is disposed to a level lower than that of a conventional multilayer transformable device in which only a dielectric elastomer is stacked.

In addition, an embodiment of the present disclosure may provide a multilayer transformable device in which a sub-transformable layer disposed between unit transformable devices functions as an adhesive layer and has a significantly higher permittivity than that of a conventional adhesive layer.

Embodiments of the present disclosure have been described in more detail with reference to the accompanying drawings. However, the present disclosure is not restricted to the embodiments, and may be variously changed and implemented within the scope of the technical idea of the present disclosure. Thus, the embodiments are disclosed to describe the technical idea of the present disclosure rather than to restrict the technical spirit. The scope of the technical idea of the present disclosure is not restricted by the embodiments. The scope of the present disclosure should be interpreted by claims below, and all technical ideas within an equivalent range thereof should be construed as being included in the scope of the present disclosure.

It will be apparent to those skilled in the art that various modifications and variation can be made in the present invention without departing from the concepts and scope of the invention. Thus, it is intended that the present invention cover the modifications and variations of this invention provided they come within the scope of the appended claims and their equivalents.

What is claimed is:

1. A display device comprising:
    a display panel;
    a multilayer transformable device on the display panel, the multilayer transformable device including:
        at least two unit transformable devices, each of the at least two unit transformable devices including a first electrode, a second electrode, and a transformable layer between the first and second electrode, and
        a sub-transformable layer between the at least two unit transformable devices,
    wherein the sub-transformable layer adhesively bonds a first electrode adjacent to an upper of the at least two unit transformable devices and a second electrode adjacent to a lower of the at least two unit transformable devices,
    wherein the transformable layer of each of the at least two unit transformable devices and the sub-transformable layer include an electro-active polymer, and
    wherein the transformable layer of each of the at least two unit transformable devices is a stretched PVDF homo-polymer film or a stretched PVDF co-polymer film, and
    wherein the sub-transformable layer includes polydimethyl siloxane and a high-dielectric filler.

2. The display device according to claim 1, wherein the transformable layers of the at least two unit transformable devices include the same electro-active polymer.

3. The display device according to claim 1, wherein the high-dielectric filler includes one or more of piezoelectric ceramics, carbon nanoparticles, metal nanoparticles, a conductive polymer, barium titanate (BaTiO$_3$) and PbZrO$_3$—PbTiO$_3$ (PZT).

4. The display device according to claim 3, wherein the high-dielectric filler is barium titanate (BaTiO$_3$).

5. The display device according to claim 1, wherein the sub-transformable layer includes a dielectric elastomer with a weight ratio of the dielectric elastomer to the high-dielectric filler being in a range of 99:1 to 50:50.

6. The display device according to claim 1, wherein the sub-transformable layer has a thickness in a range of 1 to 300 μm.

7. The display device according to claim 1, wherein the sub-transformable layer and the transformable layers of the at least two unit transformable devices are configured to contract or expand in a same direction.

8. The display device according to claim 1, wherein the sub-transformable layer has a relative permittivity of 5 or more when measured at 1 kHz.

9. The display device according to claim 1, further comprising a touch panel that is on the display panel or included in the display device.

10. The display device according to claim 1, wherein the display panel includes a flexible substrate on which a plurality of pixels are formed.

11. The display device according to claim 10, wherein the display panel is an organic light emitting diode display panel in which each pixel includes a light emitting layer.

12. A multilayer transformable device comprising:
    at least two unit transformable devices, each of the at least two unit transformable devices including a first electrode, a second electrode, and a transformable layer between the first and second electrode, and
    a sub-transformable layer between the at least two unit transformable devices,
    wherein the sub-transformable layer adhesively bonds a first electrode adjacent to an upper of the at least two unit transformable devices and a second electrode adjacent to a lower of the at least two unit transformable devices,
    wherein the transformable layer of each of the at least two unit transformable devices and the sub-transformable layer include an electro-active polymer, and
    wherein the transformable layer of each of the at least two unit transformable devices is a stretched PVDF homo-polymer film or a stretched PVDF co-polymer film, and
    wherein the sub-transformable layer includes polydimethyl siloxane and a high-dielectric filler.

13. The multilayer transformable device according to claim 12, wherein the high-dielectric filler includes one or more of piezoelectric ceramics, carbon nanoparticles, metal nanoparticles, a conductive polymer, barium titanate (BaTiO$_3$) and PbZrO$_3$—PbTiO$_3$ (PZT).

14. The display device according to claim 13, wherein the high-dielectric filler is barium titanate (BaTiO$_3$).

15. The multilayer transformable device according to claim 12, wherein the sub-transformable layer includes a dielectric elastomer with a weight ratio of the dielectric elastomer to the high-dielectric filler being in a range of 99:1 to 50:50.

* * * * *